United States Patent [19]

Grapentin et al.

[11] Patent Number: 4,517,254

[45] Date of Patent: May 14, 1985

[54] ADHESIVE METALLIZATION OF POLYIMIDE

[75] Inventors: Joachim Grapentin; Hartmut Mahlkow; Jürgen Skupsch, all of Berlin, Fed. Rep. of Germany

[73] Assignee: Schering Aktiengesellschaft, Berlin and Bergkamen, Fed. Rep. of Germany

[21] Appl. No.: 449,492

[22] Filed: Dec. 13, 1982

[30] Foreign Application Priority Data

Dec. 11, 1981 [DE] Fed. Rep. of Germany ....... 3149919

[51] Int. Cl.³ .................. B32B 15/08; B05D 3/10; C25D 5/54
[52] U.S. Cl. ..................................... 428/626; 156/668; 204/30; 427/306; 427/307; 428/473.5; 428/675; 428/936
[58] Field of Search ............... 427/307, 306, 304, 444; 156/668; 428/626, 675, 473.5, 936; 204/30

[56] References Cited

U.S. PATENT DOCUMENTS

| | | | |
|---|---|---|---|
| 3,770,528 | 11/1973 | Hermes | 428/473.5 X |
| 3,791,848 | 2/1974 | De Angelo | 204/30 X |
| 4,078,096 | 3/1978 | Redmond et al. | 427/307 X |

*Primary Examiner*—Evan K. Lawrence
*Attorney, Agent, or Firm*—Michael J. Striker

[57] ABSTRACT

A process for the adhesive metallization of polyimide through pretreating of the polyimide and subsequent activation, as well as chemical metallization, if necessary, followed by galvanic metal deposition, characterized in that the polyimide is pretreated with an aqueous solution of alkali hydroxide and an organic nitrogen compound such as one selected from the group consisting of N,N,N', N'-tetra-(2-hydroxypropyl)-ethylenediamine, ethylenediaminetetraacetic acid and nitrilotriacetic acid. The plastics metallized according to the present invention find use as shaped parts, preferably in the fields of electrical engineering and electronics.

14 Claims, No Drawings

ADHESIVE METALLIZATION OF POLYIMIDE

BACKGROUND OF THE INVENTION

The invention concerns a process, and an article made by the process, for the adhesive metallization of polyimide by pretreatment of the polyimide and subsequent activation as well as chemical and, if necessary, galvanic metal deposition.

It is known that for the purpose of metallization of non-conducting articles, processes for chemical metallization should be used.

In order to obtain sufficiently greater adhesive strength, it is necessary to roughen the surface of these articles mechanically or chemically. This occurs with many plastics, mainly by acid oxidative digestion of the surface, which is not, however, usable with plastics based upon polyimide.

This is a great disadvantage since polyimide foils advantageously find use in the electronics field in increasing measure, instead of glass fiber mats impregnated with epoxide resin. Polyimide foils are given consideration, namely, copper coated on both sides, for multi-level circuits, for example so-called multilayers, since they provide considerably better insulation values.

The application of the copper must generally be done by means of a suitable adhesive, since polyimide, in contrast to the plastics based upon epoxide resin, is not able to adhesively connect rolled on copper, which results in unfavorable working characteristics. Thus, upon boring of such multilayers, cavities form, which after the following metallization at the temperature of the adhesion process (about 250° C.) can destroy the throughcontacting, or else adhesive residue must be removed, which of necessity is done by means of highly concentrated chromic acid.

SUMMARY OF THE INVENTION

It is therefore an object of the present invention to develop a process which makes possible an adhesive metallization of polyimide without use of an adhesive.

This object is attained according to the present invention by means of a process which is thereby characterized in that the polyimide is pretreated with an aqueous solution of alkali hydroxide and an organic nitrogen compound. The invention also concerns the article made by the above process.

Particular embodiments of the process according to the present invention include that the solution contains as alkali hydroxide, lithium hydroxide, sodium hydroxide and/or potassium hydroxide;

that the solution contains 5 to 600 g/liter alkali hydroxide, preferably 50 g/liter alkali hydroxide;

that the solution contains as organic nitrogen compound a primary, secondary or tertiary amine;

that the solution contains as the organic nitrogen compound an aliphatic or cycloaliphatic mono-, di- or polyamine or their hydroxy-, carboxy-, sulfo- and/or phosphoryl-derivatives, an aromatic mono-, di- or polyamine or their hydroxy-, carboxy-, sulfo- and/or phosphoryl-derivatives, a heterocyclic mono-, di- or polyamine or their hydroxy-, carboxy- and/or sulfo-derivatives, an N-containing uni- or multi-valent heterocyclic compound or its hydroxy-, carboxy- and/or sulfo-derivatives, which if necessary can be substituted preferably by the alkyl, or nitrilo group;

that the solution contain as the organic nitrogen compound, N,N,N',N'-tetra-(2-hydroxypropyl)-ethylenediamine, ethylenediaminetetraacetic acid or nitrilotriacetic acid;

that the solution contains 5 to 30 g/liter, preferably 20 g/liter, of an organic nitrogen compound;

that the treatment be performed at temperatures from 15° to 30° C., preferably 20° C.;

that the polyimide after the pretreatment is activated in customary manner, expediently by means of a palladium-containing activator;

that the polyimide after the pretreatment and activation is chemically metallized in customary manner, preferably coppered or nickeled; and that the polyimide after the pretreatment and metallization is heated to 70° to 140° C., preferably 130° C.

The process according to the present invention allows, in surprisingly advantageous manner, the production of a polyimide-metal-composite material, preferably a polyimide-copper-composite material, which can be used for shaped parts, preferably in the fields of electrical engineering and electronics.

The further advantages, which are connected with the possibility of producing such a composite material, lie in the avoidance of all of the sources of error, which are present upon use of an adhesive. Moreover, the possibility is opened of utilizing polyimide as the last layer for the production of base material for the semiadditive technique, in order also here to be able to waive the chromic acid as treatment material. Add to this the substantially better electrical characteristic data which the construction of very more dense circuit diagrams allows, than is possible with the conventional adhesive mediators.

As polyimide should be understood all plastics as are described for example in Ullmanns' Encyclopedia of Technical Chemistry, 1970, Supplementary Volume, pp. 266-268 and pp. 318-319, Urban & Schwarzenberg, Publishers, Munich, Berlin, Vienna, Their production can follow in known manner, for example, through reaction of carboxylic acid anhydrides with aromatic diamines.

They involve extensively linear, highly heat-stable plastics of the general Formula

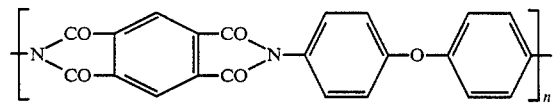

The polyimide is advantageously used in the form of foils for the process according to the present invention.

It should be understood that not only plastics of pure polyimide can be treated according to the present invention, but also such which for example are coated on one side with other plastics.

As organic nitrogen compounds which can be used according to the present invention, the following may be mentioned by way of example:
methylamine, ethylamine, propylamine, butylamine, ethylenediamine, propylenediamine, isopropylenediamine, tetramethylenediamine, octamethylenediamine, piperidine, piperazine, pyrrolidine, benzylamine, diethylenediamine, ethylenediaminetetraacetic acid, butylenediaminetetraacetic acid, hexamethylenediaminetetraacetic acid, octamethylenediaminetetraacetic acid, nitrilotriacetic acid, iminodiacetic acid, ethylenediamine-N,N'-dipropionic acid, hexamethylenediamine-N,N'-dipropionic acid, ethylenediamine-tetra-isopropanol, ethylenediamine-tetraethanol, N,N,N',N'-tetra-(2-hydroxypropyl)-ethylenediamine, triethanolamine, ethanolamine, O-phenyldiamine, aniline, toluidine, triethylamine, tributylamine, N,N,N',N'-tetramethylethylenediamine, N,N'-dimethyl-ethylenediamine, N,N-dimethylethylenediamine, N-methylethylenediamine, diethylamine, dibutylamine.

imidazol, 1-methyl-imidazol, 1-propyl-imidazol, 2,4-dimethyl-imidazol, 4-methyl-imidazol, 2-isopropyl-imidazol, 2-phenyl-imidazol, 1-benzyl-imidazol, β-imidazolopropionic acid, 1,2-dimethyl-imidazol, 1-methyl-2-hydroxymethylimidazol, 4-sulfoimidazol, 2-methyl-4-sulfo-imidazol, 2-(sulfophenyl)-imidazol, 2-isopropyl-4-sulfo-imidazol, 1-n-propyl-5-sulfo-imidazol, 1-n-propyl-4-sulfo-imidazol, 1,2-bis-(1'-imidazolyl)-ethane, 1-(p-sulfophenyl)-imidazol, histidine, 2-(imidazolo-ethyl)-pyrridine, 1-(2'-aminoethyl)-imidazol-hydrochloride, 1-(3'-aminopropyl-)imidazol-hydrochloride, 1-methyl-2-carboxymethyl-imidazol, 2-(p-sulfophenyl)-4-sulfo-imidazol, 1-methyl-2-sulfo-imidazol, 2-sulfoimidazol, 1,2-bis-(1'-methyl-5'-imidazolyl)-ethane, 5-sulfo-benzimidazol, 5,7-disulfobenzimidazol, 1,2-bis-(5'-sulfobenzimidazolyl-(2'))-ethane, 1,4-bis-(5'-sulfo-benzimidazolyl-(2'))-butane, polyvinylimidazol (degree of polymerization=2 to 500), polyallylimidazol (degree of polymerization=2 to 500), 3,5-dimethylpyrazole, 4-sulfopyrazole, 1-methylpyrazole, 3-methylpyrazole, 1,3-dimethylpyrazole, 1-phenylpyrazole, 1-carboxymethyl-pyrazole, 1-carboxyethylpyrazole, 1-aminoethyl-pyrazole-hydrochloride, 1-aminopropyl-pyrazole-hydrochloride, 3,3-dipyrazolyl, 1,3-dimethyl-5-hydroxy-pyrazole, 1-phenyl-3-methyl-5-hydroxy-pyrazole, 1-(p-sulfophenyl)-3-methyl-5-hydroxypyrazole, 1-(m-sulfophenyl)-3-methyl-5-hydroxypyrazole, 1-(p-aminophenyl)-3-methyl-5-hydroxy-pyrazole, 1-(p-chlorophenyl)-3 -methyl-5-hydroxy-pyrazole, 1-(p-sulfophenyl)-3-carboxy-5-hydroxy-pyrazole, 1,2-bis-(1'-pyrazolyl)-ethane, 7-sulfo-benzpyrazole, 1-carboxyethyl-benzpyrazole, 1,2-bis-(3'-pyrazolyl)-ethane, di-(3-pyrazolyl)-methane.

pyridine, 2-aminopyridine, 3-aminopyridine, 4-aminopyridine, 2-hydroxypyridine, 3-hydroxypyridine, 4-hydroxypyridine, 2,6-diaminopyridine, 2,3-diaminopyridine, 3,4-diaminopyridine, 2-aminomethyl-pyridine, 3-aminomethyl-pyridine, 4-aminomethylpyridine, 4-picoline, 3-picoline, 2-picoline, 2,6-lutidine, 2,4-lutidine, 3-pyridinesulfonic acid, 2,2'-dipyridyl, 1,2-di-(2'-pyridyl), 2,2'-dipyridylmethane, 2,2'-dipyridylamine, 1,2-dihydroxy-1,2-di-(2'-pyridyl)-ethane, 2,2'-dipyridyl-ethylene, 4,4'-dipyridyl-ethylene, 3-sulfo-3,3'-dipyridyl, 1,2,-di-(4'-pyridyl)-ethane.

2-amino-pyrimidine, 2,4,6-triamino-pyrimidine, 1,4-dimethyl-pyrimidine, 1,5-dimethyl-pyrimidine, 4,5-dimethylpyrimidine, 4,6-dimethylpyrimidine, 2,4-bis-(diethylamino)-pyrimidine, 3,6-bis-(dimethylamino)-pyrimidine, 3,6-bis-(ethylamino)-pyrimidine, 2-hydroxypyrimidine, 4-hydroxypyrimidine, 4,6-dihydroxy-pyrimidine, barbituric acid, cytosine, pyrimidine, bis-(2-methyl-4-pyrimidyl), 2,2'-dipyrimidyl, 4,4'-dipyrimidyl, uracil, 5-methyl-cytosine, 2-methyl-pyrimidine, 2-ethylpyrimidine, 2-phenyl-pyrimidine, 2-amino-6-ethyl-pyrimidine, 2-amino-6-methyl-pyrimidine, 2-amino-5-methoxy-pyrimidine, 2-amino-4-hydroxy-pyrimidine, 2-carboxy-pyrimidine, 5-carboxymethyl-pyrimidine, 2-carboxymethyl-5,6-dimethyl-pyrimidine, 2-methyl-5-carboxymethyl-pyrimidine, pyridazine, 3-methylpyridazine, pyrazine, 2,3,5,6-tetramethyl-pyrazine, 2,5-dimethyl-6-hydroxy-pyrazine, 2-hydroxy-pyrazine, 2-amino-pyrazine.

urotropine, 2,6-diamino-4-methyl-triazine-(1,3,5), 2,6-diamino-4-ethyl-triazine-(1,3,5), 2,6-diamino-4-propyl-triazine-(1,3,5), 2,6-diamino-4-carboxymethyl-triazine-(1,3,5), 2,6-diamino-4-carboxyethyl-triazine-(1,3,5), 2,6-diamino-4-sulfopropyl-triazine-(1,3,5), melamine, cyanuric acid, 2,4,6-tris-methylamino-triazine-(1,3,5), 2,4,6-tris-ethylamino-triazine-(1,3,5), 2,4,6-tris-diethylamino-triazine-(1,3,5), bis(4,6-diamino-2-triazinyl-(1,3,5))-methane, 1,2-bis-(4',6'-diaminotriazinyl-(1',3',5'))-ethane, 1,3-bis-(4',6'-diamino-2'-triazinyl-(1',3',5'))-propane, 1,2-bis-(4',6'-diaminotriazinyl-2'-amino)-ethane, 2,4-diamino-triazine-(1,3,5), 2,4-diamino-6-(p-sulfophenyl)-triazine-(1,3,5), 2,4-diamino-6-ethyl-triazine-(1,3,5), 2,4-dihydroxy-6-methyl-triazine-(1,3,5), cyanuric acid-hydroxyethylester, 2,4-dihydroxy-6-carboxymethyl-triazine-(1,3,5), 2-amino-4-carboxymethyl-6-n-butylaminotriazine (1,3,5), 2-amino-4-carboxy-6-n-butylamino-triazine-(1,3,5), 2-amino-4-carboxyethyl-6-n-butylamino-triazine-(1,3,5), 2-amino-4-hydroxy-triazine-(1,3,5), 3-amino-triazine-(1,2,4), 3-amino-5,6-dimethyl-triazine-(1,2,4), 4-hydroxy-5,6-dimethyltriazine-(1,2,4), 4-hydroxy-5-phenyl-triazine-(1,2,4), triazine-(1,2,4), 3,3'-bis-(5,6-dimethyl-triazine)-(1,2,4), 3,5-dihydroxy-triazine-(1,2,4), 3,5-dihydroxy-6-methyl-triazine-( 1,2,4), 3,5-dihydroxy-6-butyl-triazine-(1,2,4), 3,5-dihydroxy-6-phenyl-triazine-(1,2,4), 3,5-dihydroxy-6-carboxypropyltriazine-(1,2,4).

triazole-(1,2,4), 4-ethyl-triazole-(1,2,4), 4-methyl-triazole-(1,2,4), 4-phenyl-triazole-(1,2,4), 3,4,5-trimethyl-triazole-(1,2,4), 4-(p-sulfophenyl)-triazole-(1,2,4), 3-methyl-triazole-(1,2,4), 3-ethyl-triazole-(1,2,4), 3,5-dimethyl-triazole-(1,2,4), 3-phenyl-triazole-(1,2,4), 1-methyl-triazole-(1,2,4), 1-ethyl-triazole-(1,2,4), 1-phenyl-triazole-(1,2,4), 3-sulfo-triazole-(1,2,4), 3-amino-triazole-(1,2,4), 3,5-diamino-triazole-(1,2,4), 1,2-bis-(5'-sulfo-3'-triazolyl)-ethane, 1,2-bis-(5'-amino-3'-triazolyl)-ethane, 1,2-bis-(3'-triazolyl)ethane, 1,2-bis-(4'-methyl-3'-triazolyl)-ethane, bis-(3-triazolyl)-methane, bis-(5-sulfo-3-triazolyl)-methane, bis-(5-amino-3-triazolyl)-methane, bis-(3-triazolyl)-methane, bis-(5-sulfo-3-triazolyl), bis-(5-amino-3-triazolyl), 3,3'-bis-triazolyl, 1,2-(1'-triazolyl)-ethane, 3-(2'-aminoethyl)-triazole-(1,2,4), β-(1-triazolyl)-propionic acid, 1,4-bis-(5'-sulfo-3'-triazolyl)-butane, 1,4-bis-(5'-amino-3'-triazolyl)-butane, 1-(3-sulfopropyl)-triazole-(1,2,4), 1,2-bis-(4'-triazolyl)-ethane, 1-methyl-triazole-(1,2,3), 1-ethyl-triazole-(1,2,3), 2-ethyl-triazole-(1,2,3), 2-propyl-triazole-(1,2,3), 1-(2'-carboxyethyl)-triazole-(1,2,3), 5-sulfobenzotriazole, 5,7-disulfo-benzotriazole, benzotriazole, 4-methyltriazole-(1,2,3), 4,5-dimethyl-triazole-(1,2,3), 4-butyltriazole-(1,2,3), 4-phenyl-triazole( 1,2,3), 1-(3'-amino-propyl)-triazole-(1,2,3), 1-(2'-aminoethyl)-triazole-(1,2,3), 1,2-bis-(1'-triazolyl)-ethane.

pyrrole, 1-methyl-pyrrole, 1-ethyl-pyrrole, 1-(2'-carboxyethyl)-pyrrole, 2-methyl-pyrrole, 2,5-dimethylpyrrole, di(2-pyrrolyl)-methane, di(1-methyl-2-pyrrolyl)-methane, 2-ethyl-pyrrole, tryptophan.

Polyethyleneimine, N,N-dimethyl-polyvinylamine, polyvinylimidazole, polyallylimidazole, polyvinylpyridine, polyvinylpyrrolidone, polyvinylmorpholine, polyvinylmorpholinone, polyvinyl-5-alkyloxazolidone, N-polyvinyl-N,N'-ethylene urea, soy protein albumin, ethylenediaminetetra-(methylphosphonic acid), hexamethylphosphontriamide.

It should be understood that the compounds can be employed alone or also in mixture with one another.

As alkali hydroxide, all customary sources find use.

The performance of the process according to the present invention follows by immersing, rinsing or wetting of the polyimide articles to be metallized, with the solution employed according to the present invention. The treatment temperature and duration depend upon the quality of the polyimide, and amount to about 15° to 30° C., preferably 20° C., and about 5 to 10 minutes.

The solution to be used according to the present invention can be prepared briefly before the treatment in the desired composition and concentration. However, also stored solutions can be used with the same results. If desired, water-miscible, organic solvent can be additionally added to the solution, such as for example alcohols or esters, which likewise belong to the subject of the present invention.

The parts pretreated according to the present invention are, after the treatment, rinsed, expediently with water, and are then ready for the activation as well as chemical metallization and, if necessary, galvanic reinforcement.

For this purpose the customary activators, expediently on the basis of palladium-containing activators, and baths, preferably chemical copper or nickel baths, can be used. For the galvanic reinforcement there serve likewise the customary baths, for example a copper bath.

It has proven to be particularly favorable for the adhesive strength of the deposited metal, when the materials, after the metallization, are heated to 70° to 140° C., preferably 130° C. for which about 0.2 up to 2 hours are sufficient.

The composite material produced according to the present invention is in surprising manner of previously unobtainable stability, and allows only upon destruction of the entire composite, rupturing, but not separating, which is of extraordinary technical significance.

The novel features which are considered characteristic for the invention are set forth in particular in the appended claims. The invention itself, however, both as to its construction and its method of operation, together with additional objects and advantages thereof, will be best understood from the following description of specific embodiments.

DESCRIPTION OF THE PREFERRED EMBODIMENTS

EXAMPLE 1

A polyimide foil customary in the electrical industry is treated in a solution of 100 g potassium hydroxide in 1 liter water for 30 minutes, and then rinsed. In the next step the foil is in known manner activated with palladium ions. After rinsing in water, reduction of the still remaining adsorbed palladium ions into palladium metal follows with an aqueous 1% dimethylaminoborane solution. Pretreated in such manner, the foil arrives for an objection-free metallization in a known chemical copper bath with formaldehyde as reducing agent. For fixing of the applied chemical copper, the foil is then provided with a tempering process at 100° C. After the tempering, the extremely thin (0.5 μm) copper coating is briefly deoxidized with 10% (volume) sulfuric acid, and then in customary manner reinforced in a sulfuric acid galvanic copper bath to 40 μm. A testing of the adhesive strength reveals surprisingly good values.

EXAMPLE 2

A polyimide foil is treated in an aqueous solution of 100 g/liter sodium hydroxide and 20 g/liter N,N,N',N'-tetra-(2-hydroxypropyl)-ethylenediamine, whereby the treatment period, in comparison to Example 1, is reduced to 5 minutes. Polyimide foils treated in this solution are rinsed after 5 minutes exposure period, conventionally activated with palladium, reduced in known manner after a further rinsing operation with water, and the surface is chemically coppered. After the subsequent tempering process of 30 minutes duration at a temperature of 80° C., in known manner the thin chemical copper coating is reinforced with galvanically with copper in a sulfuric acid electrolyte. The polyimide foil displays an outstanding stability and is inseparably connected with the copper.

EXAMPLE 3

A polyimide foil is pretreated for 5 minutes in an aqueous solution of 20 g/liter ethylenediaminetetramethylphosphonic acid and 50 g/liter lithium hydroxide. Subsequently, the foil is treated in known manner with an alkaline, palladium-containing activator, rinsed in water, and then the palladium is reduced to metal in a 1% aqueous solution of dimethylaminoborane. After another rinsing in water, the activated foil is in known manner nickeled with a chemical nickel bath to about 0.2 μm thickness, and subsequently it is tempered at 110° C. for 30 minutes. For deoxidation of the surface, the foil is then treated for several minutes in 10% (volume) hydrochloric acid, rinsed, and then in known manner reinforced in a sulfuric acid copper electrolyte with 40 μm copper. The adhesion of the nickel to the polyimide is extraordinary.

It will be understood that each of the elements described above, or two or more together, may also find a useful application in other types of metallizations differing from the types described above.

While the invention has been illustrated and described as embodied in a process for the adhesive metallization of polyimide, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. In a process for the adhesive metallization of polyimide through pretreatment of the polyimide and subsequent activation as well as chemical metallizing followed, if necessary, by galvanic metal deposition, the improvement comprising pretreating the polyimide with an aqueous solution of alkali hydroxide and an organic nitrogen compound selected from the group consisting of N,N,N',N'-tetra-(2-hydroxypropyl)- ethylenediamine, ethylenediaminetetraacetic acid and nitrilotriacetic acid.

2. Process according to claim 1, wherein said solution contains as the alkali hydroxide, lithium hydroxide, sodium hydroxide and/or potassium hydroxide.

3. Process according to claim 1, wherein said solution contains 5 to 600 g/liter alkali hydroxide.

4. Process according to claim 1, wherein said solution contains 50 g/liter alkali hydroxide.

5. Process according to claim 1, wherein said solution contains 5 to 30 g/liter of the organic nitrogen compound.

6. Process according to claim 1, wherein said solution contains 20 g/liter of the organic nitrogen compound.

7. Process according to claim 1, wherein said pretreating is performed at temperatures from 15° to 30° C.

8. Process according to claim 1, wherein said pretreating is performed at 20° C.

9. Process according to claim 1, wherein said activation is performed by means of a palladium-containing activator.

10. Process according to claim 1, wherein said polyimide, after said pretreating and activation, is chemically coppered or nickelled.

11. Process according to claim 1, wherein said polyimide, after said pretreating and chemical metallizing, is heated to 70° to 140° C.

12. Process according to claim 1, wherein said polyimide, after said pretreating and said chemical metallizing, is heated to 130° C.

13. Polyimide-metal composite material, produced according to the process of claim 1.

14. Polyimide-copper composite material, produced according to the process of claim 1.

* * * * *